United States Patent [19]

Meszko et al.

[11] Patent Number: 5,212,827
[45] Date of Patent: May 18, 1993

[54] ZERO INTERMEDIATE FREQUENCY NOISE BLANKER

[75] Inventors: William R. Meszko, Fort Worth, Tex.; Joseph P. Heck, Fort Lauderdale, Fla.

[73] Assignee: Motorola, Inc., Schaumburg, Ill.

[21] Appl. No.: 650,277

[22] Filed: Feb. 4, 1991

[51] Int. Cl.$^5$ .............................................. H04B 1/16
[52] U.S. Cl. ..................... 455/219; 455/223; 455/225; 455/324
[58] Field of Search .................. 455/194.1, 200.1, 219, 455/220, 222–225, 303, 311, 324, 338, 212, 213; 358/167, 177, 176

[56] References Cited

U.S. PATENT DOCUMENTS

| | | | |
|---|---|---|---|
| 4,479,251 | 10/1984 | Dawson | 455/219 |
| 4,653,117 | 3/1987 | Heck | 455/209 |
| 4,654,885 | 3/1987 | Meszko et al. | 455/219 |
| 4,837,853 | 6/1989 | Heck | 455/208 |

FOREIGN PATENT DOCUMENTS 0205119 8/1990 Japan .................... 455/223

Primary Examiner—Reinhard J. Eisenzopf
Assistant Examiner—Chi H. Pham
Attorney, Agent, or Firm—Juliana Agon

[57] ABSTRACT

An essentially zero intermediate frequency receiver (100) for recovering an information signal from a received signal (110), which includes means for blanking noise signals which may otherwise deteriorate performance, comprises a receiver (10) for recovering the information signal and a noise blanker (28). The receiver (28) comprises at least one conversion mixer (32B) for operating on the received signal (110) to provide an essentially baseband signal (125B), at least one delay filter (40B) coupled to the conversion mixer (32B) for producing a delayed essentially baseband signal, and at least one blanker switch (S1–S4) for operating on the delayed essentially baseband signal to temporarily prevent recovery of the information signal in response to a control signal (58). To provide the control signal (58), the noise blanker (28) is coupled to the receiver (10) for operating on either the essentially baseband signal (125B) or the received signal (110) as a noise blanker input signal.

15 Claims, 1 Drawing Sheet

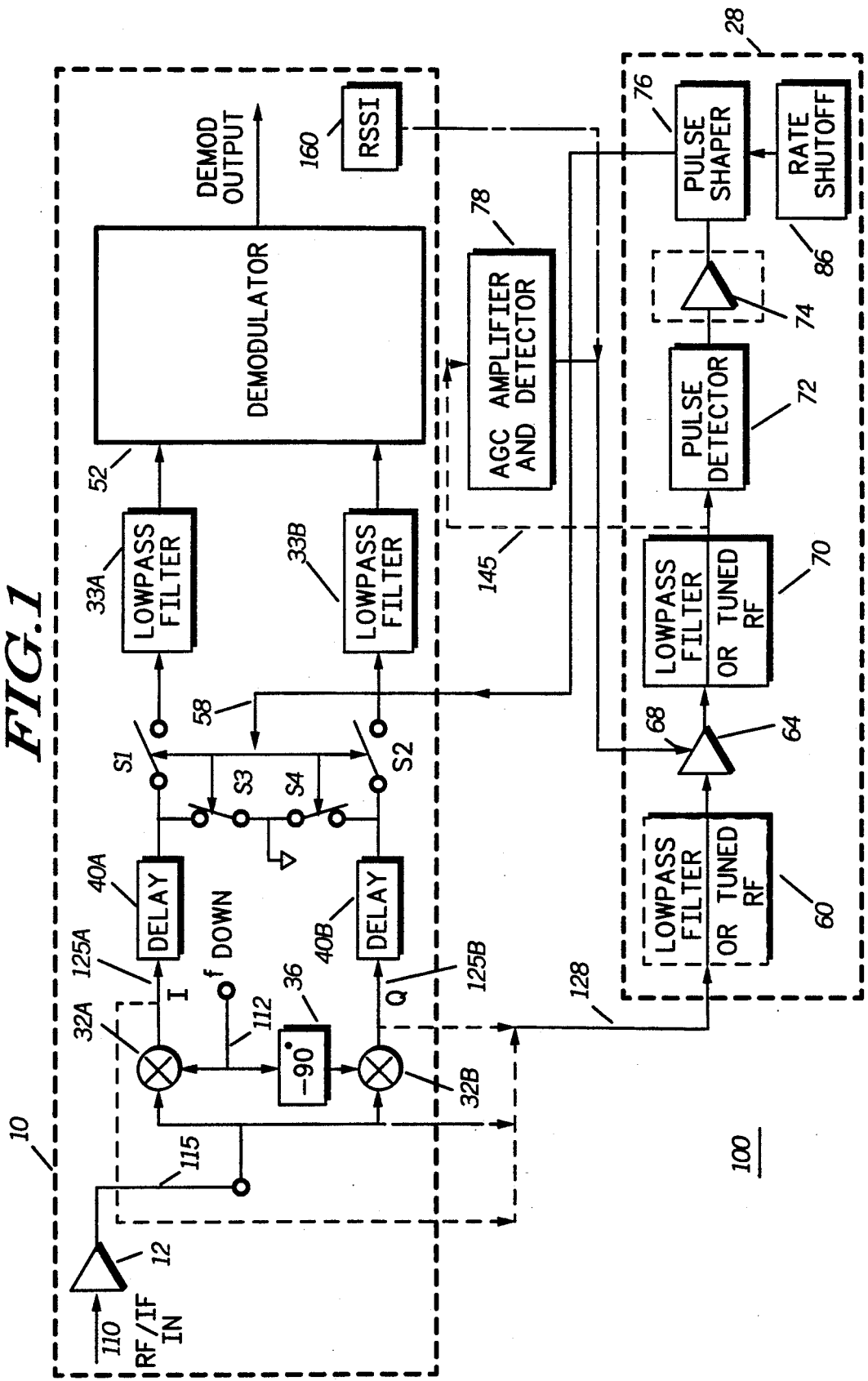

ZERO INTERMEDIATE FREQUENCY NOISE BLANKER

TECHNICAL FIELD

This invention relates generally to noise blankers and more particularly to those communication devices that employ noise blankers and essentially zero intermediate frequencies.

BACKGROUND

Those skilled in the art will appreciate the harsh operating environment of communication devices such as mobile radios. The major contributors to a severely noisy environment for the mobile radio include engine noise, (both from the vehicle using the mobile radio and surrounding vehicles), electrical interference from high power lines, and atmospheric disturbances.

Some mobile radios have employed noise blankers to suppress or eliminate these noise effects. The basic purpose of a noise blanker is to detect the presence of impulse-type noise and momentarily prevent the noise in the recovered signal from reaching the intermediate frequency (IF). For the noise blanker to function properly, it must detect the presence of noise and inhibit the signal path in the main receiver before the noise gets to the point where it is to be stopped. Historically, implementation of a noise blanker in a mobile receiver was facilitated by the commensurate bandwidth of the main receiver and the noise blanker (i.e. each about 1 megahertz). Thus, the "race" condition was not a significant problem. Since the bandwidths were practically the same, the delay was effectively the same or could be compensated for by small "lump element" filters.

Modern mobile radios however, have extremely broad bandwidths. Since most mobile radios have frequency synthesizers that can generate a wide variety of frequencies, mobile radios today use broad bandwidth filters permitting the mobile radio user to operate over a wide band of frequencies. Thus it is common for a receiver to have bandwidth of 20 or 30 megahertz. However, this bandwidth extension creates significant problems in the operation of the noise blanker circuitry. Since the band width of the main receiver may be twenty times the bandwidth of the noise blanker (thus making the noise blanker delay 20 times that of the main receiver), control pulses can not reach the blanker switch in time to prevent the noise from entering the receiver IF. To compensate for a delay of this magnitude, a "lump-element" filter cannot be used since the current trend is toward radio size reduction. Hence, the size of such a filter would be prohibitive.

A solution to the delay problem was achieved using a surface acoustic wave (SAW) filter to afford both selectivity and time delay in an appropriately sized filter. However, SAWs are expensive commodities.

To further achieve miniaturization, microelectronic techniques are desired in fabricating radios. Receivers producing substantially low frequency intermediate frequency (IF) signals are known to be easier to implement microelectronically for the intermediate stage. Since this I.F. frequency may be substantially zero Hertz (i.e. DC or baseband), the term zero I F (ZIF) is used in describing such an IF signal or stage. "Direct conversion" receivers further utilizes the ZIF advantage to eliminate a prior stage by converting an incoming signal directly to baseband. With ZIF or direct conversion, the necessary sharp selectivity is then achieved through lowpass rather than bandpass filtering. Since low frequency lowpass filters are readily fabricated in monolithic form, a much greater degree of miniaturization can be achieved in proportion to the amount of bandpass filters being converted into lowpass.

Thus a need exists to provide effective noise blanking while contemporaneously providing broad receiver bandwidth and radio size reduction.

SUMMARY OF THE INVENTION

Utilization of ZIF signals in the receiver provides some advantages, namely, it eliminates the need for complex high frequency bandpass IF filters, and facilitates integration of the IF circuitry on an integrated circuit (IC) chip.

Accordingly, it is an advantage of the present invention to provide noise blanking in a "zero-I.F." receiver.

Briefly, according to the invention, an essentially zero intermediate frequency receiver for recovering an information signal from a received signal, which includes means for blanking noise signals which may otherwise deteriorate performance, comprises a receiver for recovering the information signal and a noise blanker. The receiver comprises at least one conversion mixer for operating on the received signal to provide an essentially baseband signal, at least one delay filter coupled to the conversion mixer for producing a delayed essentially baseband signal, and at least one blanker switch for operating on the delayed essentially baseband signal to temporarily prevent recovery of the information signal in response to a control signal. To provide the control signal, the noise blanker is coupled to the receiver for operating on either the essentially baseband signal or the received signal as a noise blanker input signal.

BRIEF DESCRIPTION OF THE DRAWINGS

FIG. 1 is a block diagram of a radio employing a noise blanker of the present invention.

DETAILED DESCRIPTION OF THE PREFERRED EMBODIMENT

Referring to FIG. 1, a noise blanker 28 of the present invention is included in a portion of an FM receiver 100 having a main receiver 10. Preferably, the circuits comprising this portion of the receiver 100 utilize bipolar and metal oxide semiconductor (BIMOS) technology for integrating the circuit on an IC chip. The receiver 100 may be used in radio communication units, such as mobile two-way transceivers.

In the receiver 100, a received radio frequency (RF) signal or intermediate frequency (IF) 110 is amplified by a preamplifier 12, which produces an amplified signal 115. The input signal 115 from the preamplifier 12 is supplied to each of two parallel, substantially identical paths 32A-40A-S1-33A and 32B-40B-S2-33B.

Conventionally, elements 32A and 32B are down-conversion mixers that translate the incoming signal 115 to essentially baseband. A down-conversion frequency is supplied in quadrature to both mixers 32A and 32B using a phase shifter 36 or equivalent to provide two signals in phase quadrature. The frequency of the LO signal 112 is selected such that it is substantially equal to the frequency of the received signal 110. In more detail, the phase-shifting circuit 36 receives the local oscillator ($f_{DOWN}$) waveform 112 and produces an inphase waveform (I) and a quadrature waveform (Q) in response to the $f_{DOWN}$ waveform. The down mixers 32A–B convert the signal from the RF to essentially baseband frequency. Therefore, the pair of IF signals 125A and 125B have a substantially low frequency and are modulated at the baseband frequency. The outputs of mixers 32A and 32B are fed to two identical low pass filters 33A and 33B which remove any received spurious signals and limits the noise bandwidth of the receiver 100.

The respective outputs of these lowpass filters are coupled to a demodulator 52. Subsequently, a modulating signal may be recovered by any suitable demodulation technique at the demodulated output. The demodulation technique may preferably comprise upmixing, by an upmixer, the ZIF signal with a second high frequency local oscillator, and applying the output of the upmixer to a well known phase lock loop (PLL) or other type demodulator. In the preferred embodiment of the invention, modulating signal recovery is achieved by applying the output of each of the low pass filters 33A and 33B to a pair of suitable up conversion mixers, which produces a pair of upmixer signals in phase quadrature. The up mixers thus convert the baseband signals up to a convenient frequency for further processing and demodulation.

According to the present invention, the conventional zero intermediate frequency (IF) receiver has been modified by adding delay low pass filters 40A and 40B at the output of the downmixers 32A and 32B, series switches S1–S2 at the inputs of the baseband bandpass or lowpass filters 33A and 33B, and shunt switches S3 and S4 from the inputs of the lowpass filters 33A and 33B to analog ground. In addition, the noise blanker 28 controls the selective opening and closing of the switches S1–S4 in the main receiver 10.

After down mixing in the down mixers 32A and 32B, the pair of substantially zero baseband signals 125A and 125B are coupled to the pair of delay elements 40A and 40B. The pair of delay elements 40A and 40B may be implemented as a simple lowpass filter using a distributed RC delay line or with discrete components (resistors and capacitors). The lowpass filters 40A and 40B time delay the substantially zero IF signal for approximately 3 micro seconds and thus provide the major amount of time delay in the main receiver 10.

The noise blanking switches S1–S4 provide the means by which the received signal is interrupted and thus prevented from entering the pair of lowpass filters 33A and 33B. The blanker switches S1 thru S4 may be implemented using any suitable technology and may be, for example, one or more field effect transistors (FET's) configured either in series and/or in shunt (to the received signal path) to provide the required attenuation. The blanker switches S1–S4 are positioned between the delayed filter 40A and 40B and the main selectivity (the lowpass filters 33A and 33B) so that the main receiver 10 may "blank" after the downmixers 32A and 32B.

Normally, the blanker switches S1–S2 are "closed" and S3–S4 are "opened" to couple the output of the downmixers 32A and 32B to the input of the pair of the lowpass filters 33A and 33B to allow the received signal to be processed by the demodulator 52 and subsequent circuitry.

Thus, when the noise blanker 28 determines that a noise condition exists, the blanker switches S1–S2 are momentarily "opened" (by asserting a control input 58) to prevent the received signal from entering the lowpass filters 33A and 33B and being demodulated by the demodulator 52. In addition, the shunt switches S3 and S4 connect the delay filters' outputs to analog ground when noise is present to prevent glitches. In this manner, a long recovery time is prevented in the delay filter output circuits (which act as a current sink) which may take place if the delay filters' outputs are allowed to float to their maximum or minimum voltage levels. The "open" duration is appropriately set to prevent the recovered signal containing the noise from entering the lowpass filters 33A and 33B, after which the blanker switches S1–S2 "close" and the blanker switches S3–S4 revert to an "open" position permitting normal operation.

To provide the control signal 58 to control the switches S1–S4, the noise blanker 28 including filters 60 and 70 is coupled to the main receiver 10 for operating on either the essentially baseband signal 125A or 125B or the received signal 115 as a noise blanker input signal 128. The filter 60 sets the bandwidth of the noise blanker 28 and determines the amount of frequency spectrum that the noise blanker 28 will monitor for noise. Depending on how the noise blanker 28 is connected to the main receiver 10 to determine what the noise blanker input signal 128 is, the filters 60 and 70 are either bandpass or lowpass filters. The filtering is greatly simplified from a bandpass filter centered at the noise blanker RF frequency to a bandpass filter centered at DC which becomes a lowpass filter.

In a fixed RF channel embodiment, independent of the desired RF frequency, the noise blanker 28 accepts the received signal 115 at an RF bandpass filter 60 tuned to a fixed RF channel where noise is expected. Since the bandwidth of the main receiver 10 is broad there may be several mobile radio users transmitting in the allotted spectrum. Thus the tuned RF bandpass filter 60 of the noise blanker 28 must be set or tuned to monitor a portion of the frequency band that is not being used by other carriers or information signals since they may be interpreted as noise and the main receiver 10 will be inhibited. The bandpass filter may be implemented by any topology that facilitates tuning and may be for example, a 3 pole-coupled resonator filter having a 1 megahertz bandwidth or suitable equivalent.

On the other hand, in the preferred embodiment for easier microelectronic implementation, the noise blanker 28 accepts one of the essentially baseband signals 125A or 125B or a weighted sum of each at the more desired lowpass filter 60. In this embodiment, the noise blanker 28 has an RF channel centered at the desired receive baseband frequency since the I and Q signals are always centered at baseband. Hence, the filter 60 may be implemented easily as a lowpass filter having a bandwidth of approximately 0.5 megahertz using resistors and capacitors, as opposed to high loaded Q band pass filters or SAW delay lines. As the IF frequency drops and approaches zero, this embodiment is preferred to enable usage of more lowpass filters.

With either embodiments, the band-limited noise signal is then applied to an automatic gain controllable (AGC) amplifier 64 which accepts an AGC input signal at terminal 68. The AGC signal applied at port 68 of the amplifier 64 increases or decreases the gain of the amplifier 64 in the well known AGC operation.

The now appropriately amplified noise signal is applied to a tuned RF bandpass filter 70 in the fixed RF channel embodiment or a simple lowpass filter 70 in the preferred embodiment to again band-limit the signal which is then coupled to a pulse detector 72. The pulse detector 72 monitors the amplified band-limited signal and compares it to a predetermined threshold to determine when noise spikes (or pulses) are present. When the noise peaks exceed the predetermined threshold the pulse detectors 72 outputs a pulse indicating that excessive noise is present. The pulse output from the pulse detector 72 is amplified in an optional separate pulse amplifier 74 (or incorporated in a pulse shaper 76) which provides sufficient gain to the pulse to trigger a pulse shaper 76.

The pulse shaper 76 accepts the amplified "trigger" pulse and first generates a substantially rectangular pulse which is then shaped into a trapezoidal shape or any other desirable shapes have sloped rising and falling edges and having a predetermined pulse duration. The duration of the pulse or the control signal 58 generated by the pulse shaper 76, is set to allow sufficient time for the blanker switches S1-S4 to reach and maintain maximum attenuation, thus preventing the noise signal, being delayed by the pair of delayed filters 40A and 40B, from entering the pair of lowpass filters 33A and 33B. Accordingly, the duration of the pulse generated by the pulse shaper 76 may be set to an appropriate duration to allow the blanker switches S1-S4 to reach full attenuation and remain "open" until the noise signal has sufficient time to pass through the delay filters 40A and 40B taking into account the varying parameters.

A rate shutoff circuit 86 is shown as an optional feature for the noise blanker 28. As is known, rate shutoff circuit measure the repetition rate of detected noise pulses without regard to their amplitude. If the rate exceeds a predetermined value, the circuit 86 will disconnect the blanking function from the essentially Zero IF signal, since if the repetition is too high, no signal will be recovered anyway since "blanking" will be continuous.

As previously mentioned, the amplifier 64, and thus the noise blanker 28, is controlled by the AGC signal. Generally, an AGC signal is commonly used in AM receivers as a control for amplifiers. Basically, the goal of the AGC circuit is to reduce the gain of the blanker RF channel when the desired signal increases, thereby desensitizing the blanker 28 and increasing the minimum noise pulse amplitude required to initiate blanking. As the desired signal level increases, the smaller noise pulses no longer create objectionable interference, whereas blanking would create interference. Accordingly, an AGC circuit including an AGC RF amplifier and detector 78 controls the gain of an AGC amplifier 64 and reduces the gain to reduce the sensitivity of the noise blanker 28 when the desired received signal exceeds the threshold level.

In the preferred embodiment of using a lowpass filter 60 in the noise blanker 28 to feed in the essentially baseband signal 125A or 125B, both noise and the desired signal is received since the blanker's RF channel (60) is centered at the desired receive (essentially baseband) frequency. Accordingly, the noise signal and the desired signal received and filtered by the lowpass filter 70 is utilized as a feed back signal 145 to control the AGC amplifier and detector 78. On the other hand, in the alternate embodiment of the fixed RF channel being tuned for expected noise in the noise blanker 28, the desired signal is not present in the fixed RF channel since the tuned RF filters are intentionally tuned to eliminate the desired signal. Therefore, another source of AGC control is needed. Hence, in the main radio receiver 10 (maybe from the demodulator 52), a received signal strength indicator (RSSI) signal from the RSSI 160 may be utilized to indicate the strength of the signal (including noise) received. Thus, the AGC signal can be developed from the RSSI 160 where the RSSI signal output from the RSSI 160 is a DC voltage which varies proportionally to the signal strength of the received signal including noise. Coupled from the RSSI 160, the RSSI signal is applied to the AGC port 68 of the amplifier 60 to control the gain in the well known AGC operation.

In summary, the noise blanking circuitry can be greatly simplified for a receiver with a zero IF because the IF filtering is done at audio frequencies. In this case, filtering normally done with narrow-band RF tuned bandpass circuits or the equivalent can be replaced with lowpass filters. The filtering is greatly simplified from a bandpass filter centered at the noise blanker RF frequency to a lowpass filter centered at DC. The lowpass filter can be implemented using either simple resistors and capacitors (RC) inductors and capacitors (LC), or active integrated filters. If lossiness is not a big problem, RC's are probably preferable since they are easier to integrate.

What is claimed is:

1. An essentially zero intermediate frequency receiver for recovering an information signal from a received signal said receiver comprising:
   receiver means for recovering said information signal comprising:
   a first conversion means for operating on said received signal to provide an essentially baseband inphase signal;
   a second conversion means for operating on said received signal to provide an essentially baseband quadrature signal;
   a first delay means coupled to said first conversion means for producing a delayed essentially baseband inphase signal;
   a second delay means coupled to said second conversion means for producing a delayed essentially baseband quadrature signal;
   at least one blanker switch means for operating on said delayed essentially baseband signals to temporarily prevent recovery of said information signal in response to a switch control signal;
   means for providing a gain control signal; and
   noise blanking means for blanking noise signals which may otherwise deteriorate performance, said noise blanking means coupled to said receiver means for operating on either at least one of said essentially baseband signals or said received signal as a noise blanker input signal to provide said switch control signal;
   said noise blanking means comprising;
   input filtering means for filtering said noise blanker input signal to provide a filtered signal;
   amplifier means for amplifying said filtered signal, in response to said gain control signal, to provide an amplified signal; and
   means for generating said switch control signal from said amplified signal.

2. The receiver of claim 1 wherein said delay means comprises an R-C lowpass filter.

3. The receiver of claim 1 wherein said conversion means is a pair of mixers connected in parallel.

4. The receiver of claim 1 wherein said input filtering means comprises at least one bandpass filter for filtering said received signal to provide said filtered signal.

5. The receiver of claim 1 wherein said input filtering means comprises
   first lowpass filtering means for filtering said at least one of said essentially baseband signals to provide said filtered signal.

6. The receiver of claim 5 wherein said first lowpass filtering means filters said essentially baseband inphase signal to provide said filtered signal.

7. The receiver of claim 5 wherein said means for generating said control signal further comprises:
   second lowpass filtering means for receiving said amplified signal and providing a filtered output signal;
   pulse detector means for operating on said filtered output signal to provide an output pulse whenever the noise contents of said filtered signal exceeds a predetermined threshold; and
   pulse shaper means for receiving said output pulse and for providing a desired output pulse.

8. An essentially zero intermediate frequency receiver for recovering an information signal from a received signal said receiver comprising:
   means for splitting said received signal into a pair of input signals;
   receiver means for recovering said information signal comprising:
      at least one conversion means for operating on each one of said pair of input signals to provide a pair of essentially baseband signals in phase quadrature;
      at least one lowpass delay means coupled to each one of said conversion means for producing a pair of delayed essentially baseband signals in phase quadrature; and
      at least one blanker switch means for operating on said pair of delayed essentially baseband signals to temporarily prevent recovery of said information signal in response to a control signal;
   means for providing an automatic gain control (AGC) signal for controlling the sensitivity of a noise blanking means; and
   said noise blanking means for blanking noise signals which may otherwise deteriorate performance, said noise blanking means coupled to an output of at least one of said conversion means to provide a noise blanker input signal for operating on at least one of said essentially baseband signals to provide said control signal;
   said noise blanking means comprising:
      input filtering means for filtering at least one of said essentially baseband signals to provide a filtered signal;
      amplifier means for amplifying said filtered signal, in response to said gain control signal, to provide an amplified signal; and
      means for generating said switch control signal from said amplified signal.

9. The receiver of claim 8 wherein said input filtering means is a
   first lowpass filter for setting the bandwidth of said noise blanking means to determine the amount of frequency spectrum that said noise blanking means will monitor for noise.

10. The receiver of claim 9 wherein said control signal generating means further comprises:
    second lowpass filter for receiving said amplified signal and providing a filtered output signal;
    pulse detector means for operating on said filtered output signal to provide an output pulse whenever the noise contents of said filtered signal exceeds a predetermined threshold; and
    pulse shaper means for receiving said output pulse and for providing a desired output pulse.

11. The receiver of claim 10 further comprising:
    AGC detecting means, coupled to an output of said second lowpass filter for providing said AGC signal in a feedback loop comprising said second lowpass filter, said AGC detecting means, and said amplifier means.

12. An essentially zero intermediate frequency receiver for recovering an information signal from a received signal, said receiver comprising:
    means for splitting said received signal into first, second, and third input signals;
    receiver means for recovering said information signal comprising:
       at least one conversion means for operating on each one of said first and second input signals to provide a pair of essentially baseband signals in phase quadrature;
       at least one lowpass delay means coupled to each one of said conversion means for producing a pair of delayed essentially baseband signals in phase quadrature; and
       at least one blanker switch means for operating on said pair of delayed essentially baseband signals to temporarily prevent recovery of said information signal in response to a control signal; and
    means for providing an automatic gain control (AGC) signal for controlling the sensitivity of a noise blanking means; and
    said noise blanking means coupled to an input of said conversion means for operating on said third input signal to provide said control signal;
    said noise blanking means comprising:
       input filtering means for filtering said third input signal to provide a filtered signal;
       amplifier means for amplifying said filtered signal, in response to said AGC signal, to provide an amplified signal; and
       means for generating said switch control signal from said amplified signal.

13. The receiver of claim 12 wherein said input filtering means is a
    tuned bandpass filter tuned to a fixed frequency spectrum where noise is expected.

14. The receiver of claim 13 wherein said control signal generating means further comprises:
    tuned bandpass filtering means for receiving said amplified signal and providing a filtered output signal;
    pulse detector means for operating on said filtered output signal to provide an output pulse whenever the noise contents of said filtered signal exceeds a predetermined threshold; and
    pulse shaper means for receiving said output pulse and for providing a desired output pulse.

15. The receiver of claim 14 wherein said means for providing an automatic gain control (AGC) signal comprises a
    received signal strength indicator for indicating the strength of said received signal to provide said AGC signal.

* * * * *